United States Patent
Lao

(10) Patent No.: US 6,287,960 B1
(45) Date of Patent: Sep. 11, 2001

(54) SELF ALIGNED DUAL INLAID PATTERNING AND ETCHING

(75) Inventor: Keith Q. Lao, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/566,500

(22) Filed: May 8, 2000

(51) Int. Cl.[7] .......................... H01L 21/24; H01L 21/44; H01L 21/4763

(52) U.S. Cl. ......................... 438/637; 438/618; 438/687; 438/700; 438/743

(58) Field of Search ..................... 438/537, 687, 438/622, 636, 723, 724, 740, 624, 637, 638, 634, 700, 618, 633, 719, 623, 743, 744

(56) References Cited

U.S. PATENT DOCUMENTS

| | | | |
|---|---|---|---|
| 6,063,711 | * | 5/2000 | Chao et al. ........................... 438/724 |
| 6,083,822 | * | 7/2000 | Lee ...................................... 438/624 |
| 6,100,648 | * | 8/2000 | Jang .................................... 430/312 |
| 6,174,810 | * | 1/2001 | Islam et al. ......................... 438/687 |

* cited by examiner

Primary Examiner—Matthew Smith
Assistant Examiner—Igwe U. Anya
(74) Attorney, Agent, or Firm—Robert A. Rodriguez; Joseph P. Lally

(57) ABSTRACT

A semiconductor device fabrication method in which a conductive interconnect is formed over a semiconductor substrate. First and second dielectric films are formed over the interconnect. A first patterning layer is formed over the second dielectric. A via opening is then formed in the first patterning layer and a second patterning layer is formed over the first patterning layer. A trench opening is defined in the second patterning layer. A first portion of the second dielectric film exposed by the trench opening is removed to define a via pattern. A portion of the first patterning layer exposed by the second patterning layer is then removed to expose a second portion of the second dielectric film, which is then removed to define a trench portion of a dual inlaid opening in the second dielectric. A portion of the first dielectric film defined by the via pattern is then removed to expose the conductive region.

20 Claims, 4 Drawing Sheets

US 6,287,960 B1

SELF ALIGNED DUAL INLAID PATTERNING AND ETCHING

FIELD OF THE INVENTION

The present invention is related to the field of semiconductor processing and more particularly to a process of forming a dual inlaid interconnect structure with a self aligned contact.

RELATED ART

In the field of semiconductor fabrication, dual inlaid interconnect processing is well known. In a dual inlaid interconnect process (also referred to herein as a dual inlaid process), each interconnect level and its corresponding contact level are formed by etching patterns into an underlying interlevel dielectric (ILD) layer. After the formation of the patterns in the ILD layer, a conductive material such as, for example, copper is deposited and typically thereafter polished with a chemical mechanical polish (CMP) process. Variations on dual inlaid processes include trench-first processes, via-first processes, and buried-via processes. See, for example, Singer, *Dual Damascene Challenges Dielectric Etch*; Semiconductor International, Pages 68–72 (August, 1999).

Turning now to FIG. 1, a partial cross sectional view of a semiconductor substrate 10 illustrating one embodiment of a conventional dual inlaid process is depicted. In FIG. 1, wafer 10 includes a substrate 100 on which an interconnect 102 has been formed. Interconnect 102 may comprise any of a variety of conductive materials including, as examples, aluminum, copper, or polysilicon. Following the formation of interconnect 102, an etch stop layer (ESL) 104 is formed over substrate 100. A first ILD layer 106 is then deposited over ESL 104 and a second ESL 108 is then deposited on first ILD layer 106. A second ILD layer 110 is formed on second ESL 108. A resist layer 112 is then formed and patterned over second ILD layer 110. As depicted in FIG. 1, photoresist layer 112 has been patterned and a first etch step has been performed to etch a trench into second ILD layer 110 and through the second ESL 108. Following the formation of the trench in second ILD layer 110, the photoresist layer 112 is removed.

Turning now to FIG. 2, a subsequent processing step is depicted in which a second photoresist layer 202 has been deposited and patterned over second ILD layer 110 in preparation for the formation of a contact through the first ILD layer 106 to interconnect 102. As depicted in FIG. 2, the patterning of the photoresist layer 202 can result in a misalignment of the contact with respect to the underlying trench and interconnect. It will be appreciated by those skilled in semiconductor fabrication, that the misalignment of photoresist layer 202 undesirably exposes portions of second ILD layer 110.

Turning now to FIG. 3, a cross section view following a subsequent etch process is illustrated. As seen in FIG. 3, the misalignment of photoresist layer 202 resulted in a contact opening 302 that undesirably extends below an upper surface of substrate 100 at the perimeter of interconnect 102 to expose sidewall portions of interconnect 102. In addition, if the contact opening 302 were in close proximity to an adjacent trench (not depicted in FIG. 3), the misalignment could result in a narrowing of the ILD layer 110 between contact opening 302 and the adjacent trench. If the dimensions of an ILD layer 110 between adjacent contact 302 and an adjacent trench falls below a minimum specified value (i.e., minimum pitch), a subsequent etch or polish process could create an unintended short between contact 302 and an adjacent trench. Therefore, it would be desirable to implement a process that minimizes the susceptibility of a dual inlaid process to contact misalignment without significantly increasing the cost or complexity of the process.

DETAILED DESCRIPTION

Turning now to FIGS. 4 through 8, cross sectional views at successive stages of a process for forming a semiconductor device are depicted.

Figure 1:
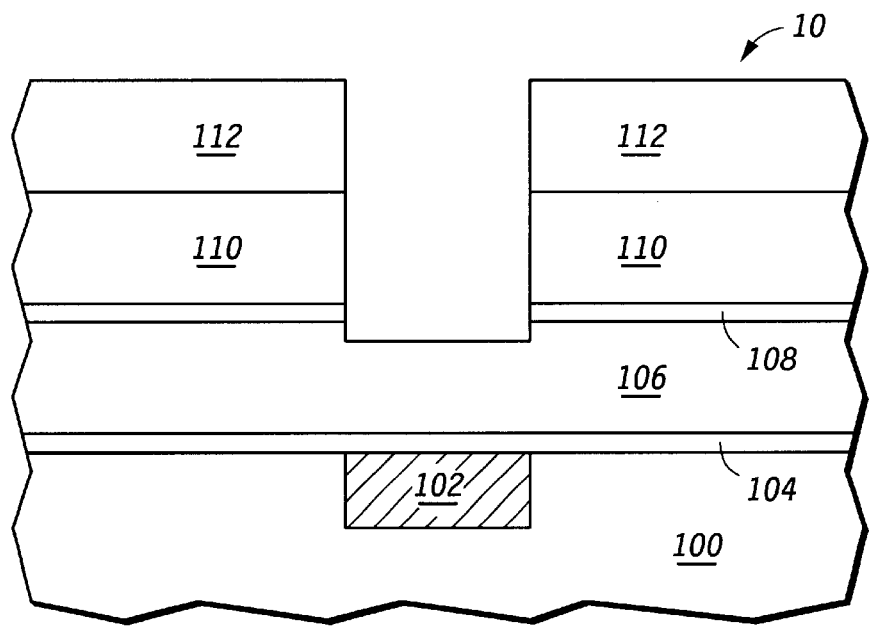
FIG. 1 is partial cross sectional view of a dual inlaid process according to the prior art.
Figure 2:
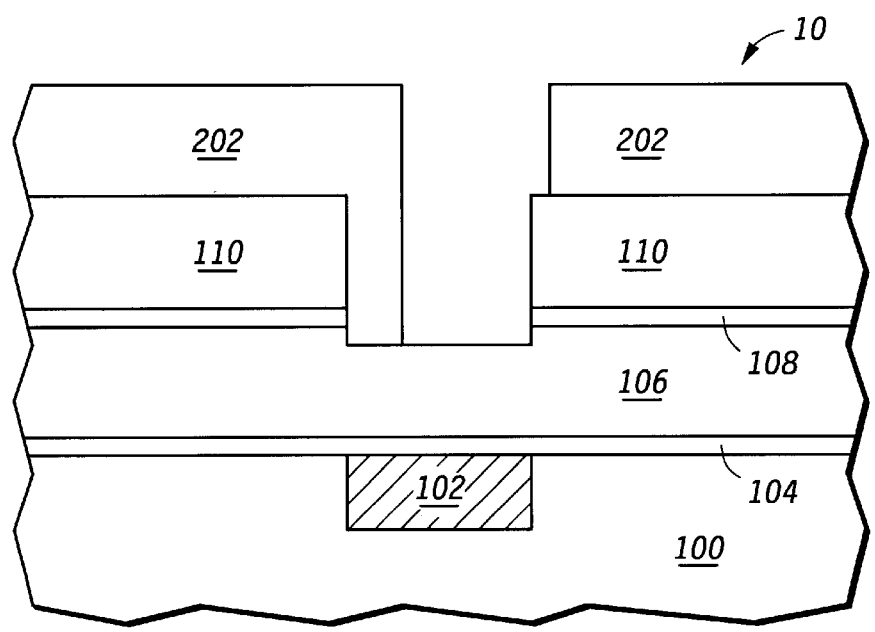
FIG. 2 is a processing step subsequent to FIG. 1 in which a contact pattern has been formed in a photoresist layer.
Figure 3:
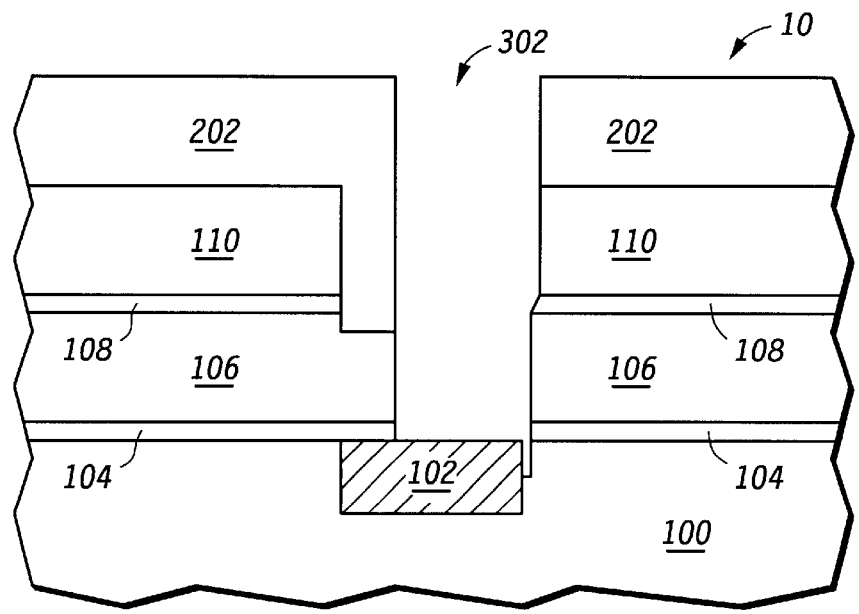
FIG. 3 is a processing step subsequent to FIG. 2 in which a contact has been formed through first and second interlevel dielectric layers.
Figure 4:
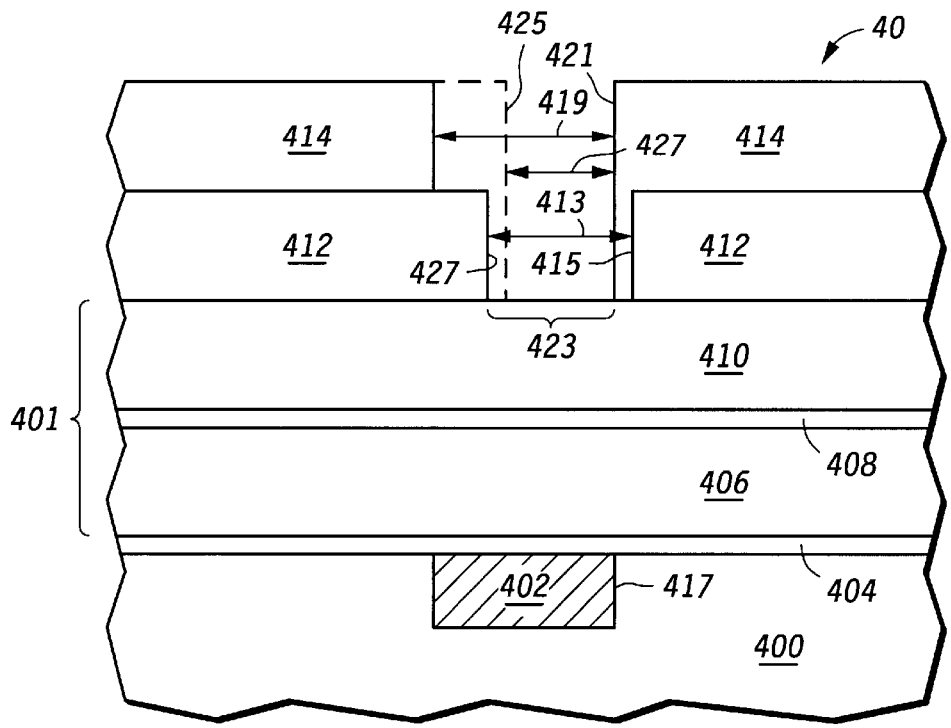
FIG. 4 is a partial cross sectional view of a dual inlaid process according to one embodiment of the present invention.

In FIG. 4, an ILD layer 401 has been formed on a semiconductor device substrate 400 of semiconductor wafer 40. In the depicted embodiment, ILD layer 401 is formed over conductive interconnect 402 and includes a first etch stop layer (ESL) 404 over conductive interconnect 402, a first dielectric film 406 over first ESL 404, a second ESL 408 over first dielectric film 406, and a second dielectric film 410 over second ESL 408. In one embodiment, first ESL 404 is a plasma enhanced nitride (PEN) and second ESL 408 is a silicon oxynitride (SiON). In one embodiment, first and second dielectric films 406 and 410 comprise an oxide such as a plasma enhanced chemical vapor deposition (PECVD) oxide formed using a tetra ethyl ortho silicate (TEOS) source gas.

Following the formation of interlevel dielectric layer 401, a first patterning layer 412 is formed over ILD layer 401. First patterning layer 412 may comprise a conventionally deposited photoresist layer as is well known in the field of semiconductor fabrication. A first opening 413 is then formed in first patterning layer 412. First opening 413, in one embodiment, is a patterned via opening that will subsequently define a via portion of a dual inlaid opening 705 (shown in FIG. 7) that will ultimately terminate at conductive interconnect 402 in substrate 400. As depicted in FIG. 4, first opening 413 has been misaligned with respect to the underlying interconnect 402. The misalignment is represented in FIG. 4 by the lateral displacement between sidewall 415 of first opening 413 and sidewall 417 of interconnect 402. In a conventional inlaid process, misalignment of a via relative to an underlying interconnect is undesirable because it can result in a via etch that encroaches below the surface of the semiconductor substrate as described previously. In addition, misalignment of the via can undesirably produce electrical shorts with adjacent conductive structures and can therefore require compensation in the form of a more relaxed minimum pitch between adjacent inlaid structures.

In one embodiment, after forming the opening 413, first patterning layer 412 is subjected to a deep ultra violet (UV) bake that results in the cross linking of a photo active compound in first patterning layer 412, thereby rendering first patterning layer 412 insensitive to subsequent exposure. In one embodiment. the deep UV bake of first patterning layer 412 is carried out in a conventional deep UV bake chamber at a temperature in the range of approximately 200–250° C. for a duration of approximately 30–120 seconds, depending upon the thickness of patterning layer 412. A thickness of the first patterning layer 412 is preferably in the range of approximately 200–600 nanometers and still more preferably in the range of approximately 200–400 nanometers.

Following the formation and patterning of first patterning layer 412, a second patterning layer 414 is formed over first patterning layer 412 and patterned to form a second opening 419. In one embodiment, second opening 419 is a patterned trench opening that will subsequently define the trench portion of dual inlaid opening 705 (shown in FIG. 7). Preferably, a thickness of second patterning layer 414 is in the range of approximately 600–900 nanometers. The patterning of second patterning layer 414 leaves the underlying first patterning layer 412 substantially unaltered. In one embodiment, differentiation between first and second patterning layers 412 and 414 is achieved by performing a deep UV bake of first patterning layer 412 as described previously. In yet another embodiment, the first and second patterning layers may be differentiated by utilizing a negative photoresist for first patterning layer 412 and a positive photoresist for second patterning layer 414 or vice versa.

By depositing second patterning layer 414 directly on first patterning layer 412, the via portion of dual inlaid opening 705 is advantageously self aligned to the trench portion, thereby eliminating the misalignment of the via with respect to the underlying interconnect 401. In the depicted embodiment, sidewall 421 of second patterning layer 214 overlaps sidewall 415 of first patterning layer 412. In this embodiment, sidewall 421 defines a boundary of second opening 419 and redefines a boundary of first opening 413 such that first opening 413 and second opening are self aligned at a common boundary defined by sidewall 421 of second patterning layer 414. Following the formation and patterning of first and second patterning layers 412 and 414, a portion 423 of ILD layer 401 is exposed by first opening 413.

In an alternative embodiment (represented in FIG. 4 by the dotted line), a second sidewall 425 of second patterning layer 414 overlaps a second sidewall 427 of first patterning layer 412. In this embodiment, it will be appreciated that a first dimension of first opening 413 is defined by the dimension 427 of the opening in the second patterning layer 414 and a second dimension (not shown), which is on an axis perpendicular to dimension 427 is defined by the dimensions of the first opening 413. Since first patterning layer 412 no longer defines the final dimensions of first opening 413 (on one axis), the alignment and feature sizing tolerances (critical dimensions) of the photomask used to define the opening 413 can be relaxed. Given sufficient relaxation of such tolerances, less expensive photolithography equipment could be used to pattern the layer and define the opening 413. An I-line stepper, for example, might be used to pattern first patterning layer 412 instead of a more expensive UV stepper.

Figure 5:
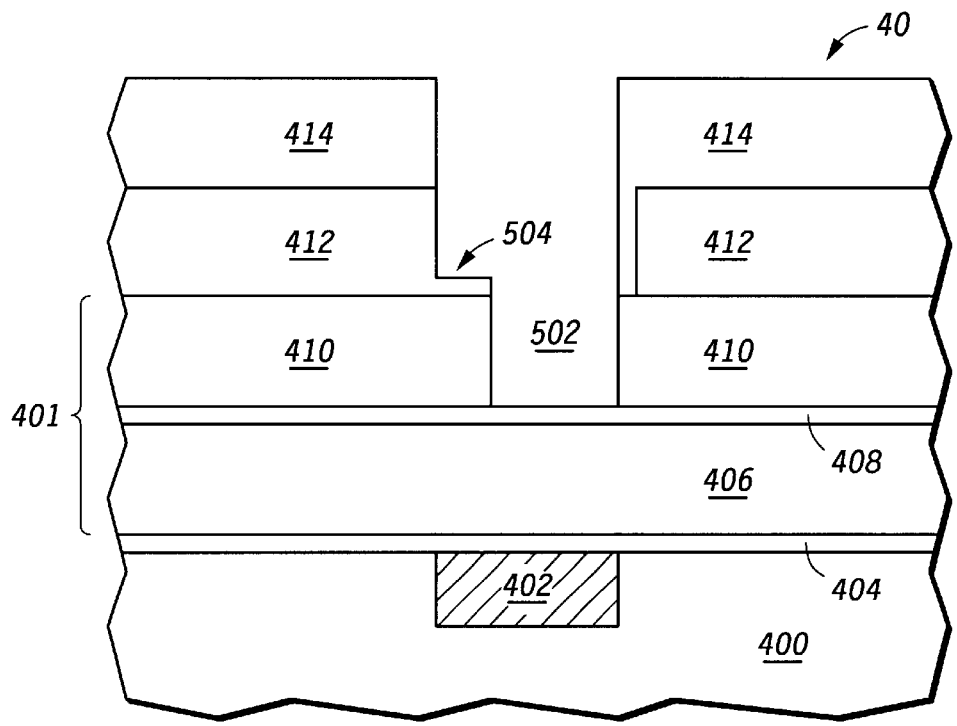
FIG. 5 is a processing step subsequent to FIG. 4 in which a via has been etched through the second interlevel dielectric.

Turning now to FIGS. 4 and 5 together, a first portion of ILD layer 401 exposed by first opening 413 has been removed to form opening portion 502. Preferably, the removal of the first portion of ILD layer 401 is accomplished using a reactive ion etch (RIE) oxide etch process that exhibits selectivity in excess of approximately 5:1 with respect to patterning layers 412 and 414. In the depicted embodiment, the etch process used to etch through the first portion of ILD layer 401 (i.e. second dielectric film 410) removes a portion of first patterning layer 412 that is exposed by second opening 419 in second patterning layer 414 leaving behind a portion 504 of first patterning layer 412 following the removal of the first portion of the ILD layer 401. In the depicted embodiment. etching first portion of ILD layer 401 to form the opening 502 includes etching through second dielectric film 410 down to the second ESL 408 as shown in FIG. 5.

Figure 6:
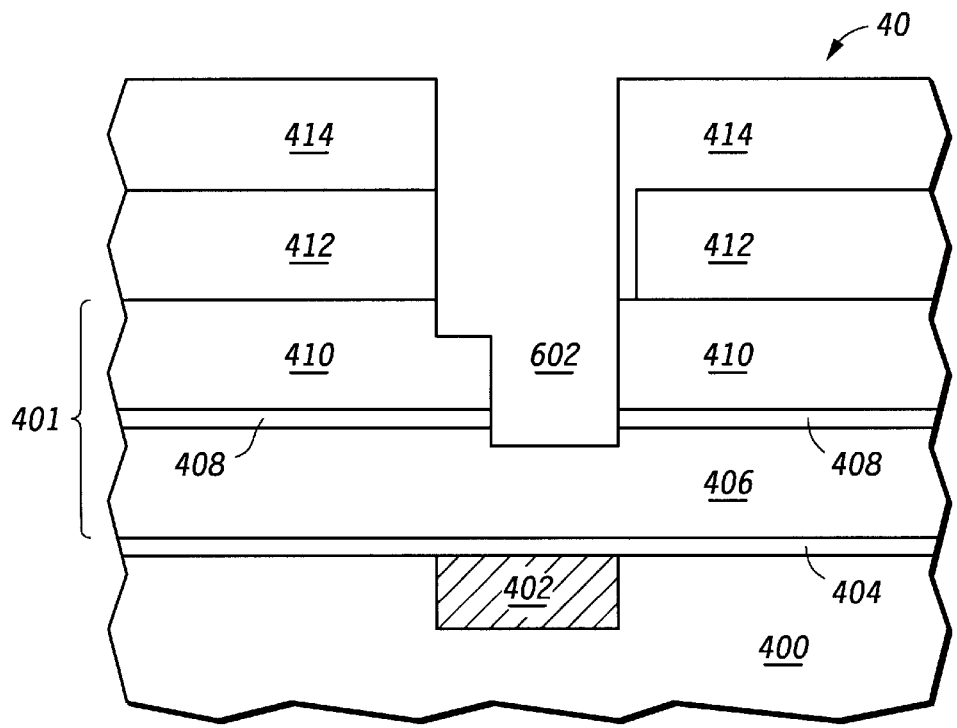
FIG. 6 is processing step subsequent to FIG. 5 in which the etch stop layer and any remaining photoresist have been removed.

Turning now to FIGS. 5 and 6, the portion of second ESL 408 exposed by the opening 502 of ILD layer 401 is removed. In one embodiment, the removal of exposed portions of second ESL 408 is accomplished with a plasma etch process using a combination of $CHF_3$ and argon. In the depicted embodiment, the selectivity of the process used to etch through second ESL 408 is adjusted to remove the remaining portion 504 of first patterning layer 412.

Figure 7:
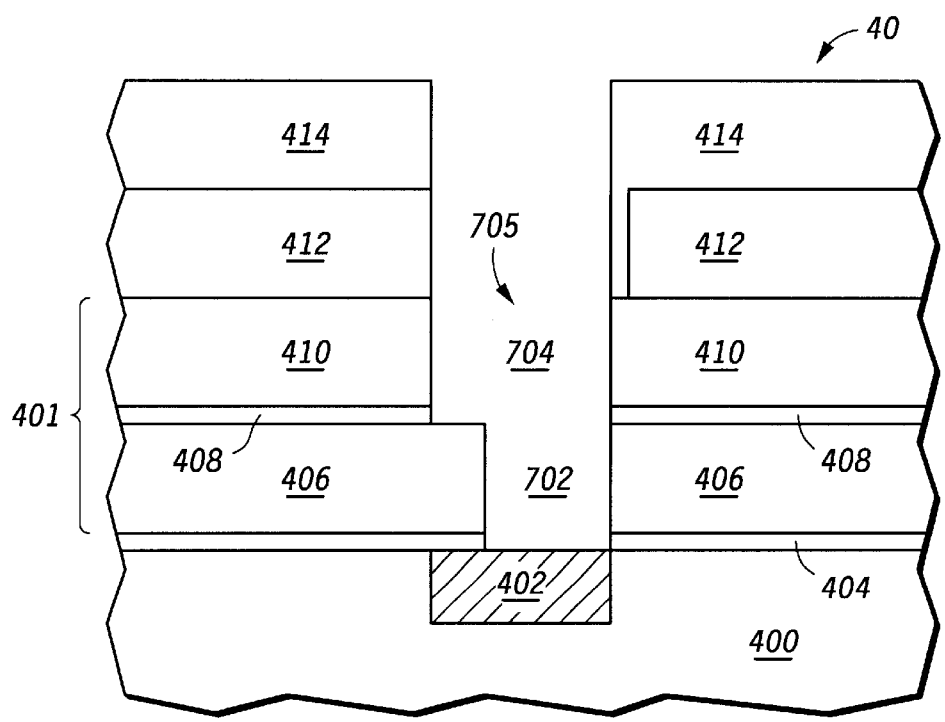
FIG. 7 is a processing step subsequent to FIG. 6 in which the via has been etched through to the interconnect.

Turning now to FIG. 7, an etch is performed to remove a second portion of ILD layer 401, thereby forming the trench opening portion 704 and a third portion of ILD layer 401, thereby forming the via opening portion 702. The trench opening portion 704 is defined by second opening 419 (depicted in FIG. 4), and the via opening portion 702 is defined by the first opening 413 (depicted in FIG. 4). The combination of the trench and via opening portions 704 and 702 defines a dual inlaid opening 705 in ILD layer 401. The trench portion has been formed by the removal of first and second portions of ILD layer 401 and a via portion has been formed by the removal of the third portion of ILD layer 401. In one embodiment, the removal of the second and third portions is accomplished by resuming the oxide etch process that was used to remove the first portions of second dielectric film 410 and form opening portion 502 as depicted in FIG. 5. In the depicted embodiment, exposed portions of second ESL 408 are removed followed by the resumption of the oxide etch process thereby resulting in the removal of portions of first dielectric film 406 and the removal of additional portions of second dielectric film 410 as defined by first and second openings 413 and 419 respectively. In the embodiment depicted in FIG. 7, the oxide etch chemistry that results in the removal of portions of first dielectric film 406 is performed until the etch reaches first ESL 404 at which the point the etch chemistry is modified to complete the formation of dual inlaid opening 705 by removing remaining portions of first ESL 404 over interconnect 402.

The depicted embodiment of the invention is described with respect to a trench-first dual inlaid process in which the removal of the first and second portions of ILD layer 401 defines a trench portion of dual inlaid opening 705 and the removal of the third portion of ILD layer 401 defines a via portion of the dual inlaid opening.

Figure 8:
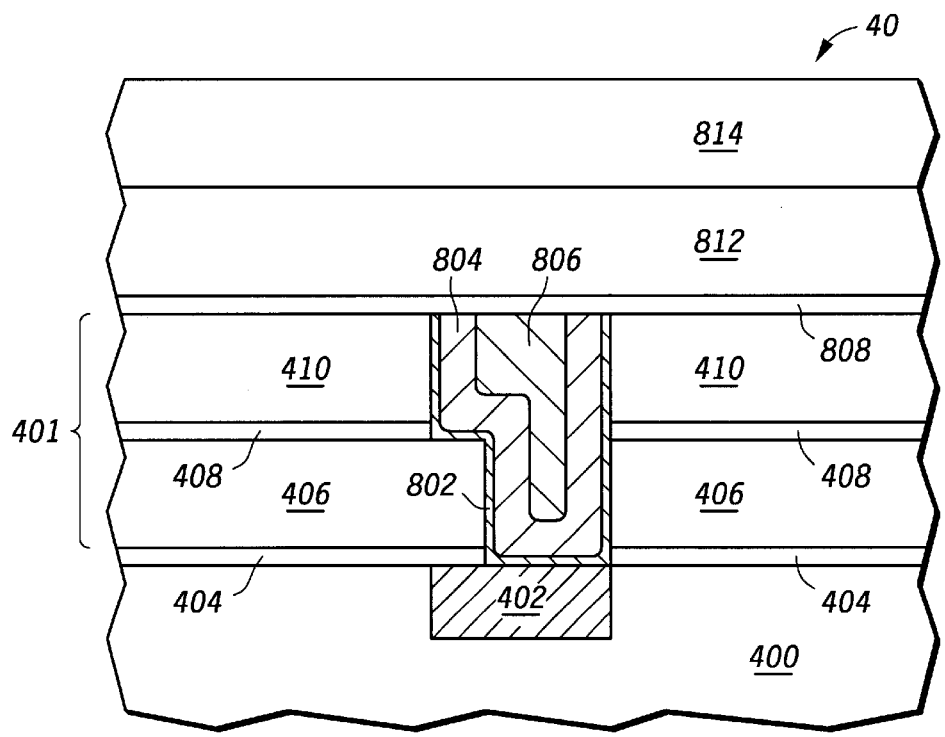
FIG. 8 is a processing step subsequent to FIG. 7 in which the trench and via have been filled with a conductive material and a passivation layer formed over the wafer.

Turning now to FIGS. 7 and 8, following the formation of dual inlaid opening 705, a semiconductor device is formed by filling dual inlaid opening 705 with a conductive material and forming a passivation layer over the wafer. In the embodiment depicted in FIG. 8, dual inlaid opening 705 is filled by initially forming a barrier layer 802 within the opening 705. In one embodiment, the barrier layer 802 comprises a refractory metal, or a refractory metal nitride such as, for example, tantalum (Ta) or tantalum nitride (TaN). Following the formation of barrier layer 802, a copper seed layer 804 is formed over barrier layer 802, typically, with a PVD sputtering process. In the depicted embodiment, a second copper portion 806 is formed in opening 705 with an electroplating process that fills the opening 705. After the deposition of barrier layer 802 and the formation of copper portions 804 and 806, a CMP process is used to remove portions of the conductive material exterior to opening 705. In the depicted embodiment, a capping layer 808 is formed over a copper portions 804 and 806. In one embodiment, capping layer 808 may comprise a plasma enhanced nitride or other suitable material. Following the formation of capping layer 808, a passivation layer 812, such as a silicon oxynitride and/or a plasma enhanced nitride layer, and a polyimide layer 814 are formed over capping layer 808. It will be appreciated that while the embodiment illustrated in FIG. 8 illustrates only a single ILD layer 401 and its corresponding interconnect structure (comprised of copper portions 804 and 806), multiple interconnect levels and corresponding interlevel dielectrics may be suitably stacked one upon the other to form a multi-level semiconductor device, in which case the passivation layers 812 and 814 would be formed only on the upper most interconnect level and interlevel dielectric layer.

Thus, the process described herein facilitates the formation of a dual inlaid opening that is less susceptible to misalignment between the trench mask and the via mask and produces a self-aligned contact structure. In addition, the process may be used to relax the critical dimensions and alignment tolerances of the first patterning layer thereby potentially resulting in replacement of a critical photolithography step with a more relaxed and less expensive photolithography step.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be considered as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:

forming an interlevel dielectric layer over a semiconductor device substrate;

forming a first patterning layer over the interlevel dielectric layer;

defining a first opening in the first patterning layer;

forming a second patterning layer over the first patterning layer;

defining a second opening in the second patterning layer, wherein the second opening exposes a portion of the first opening and a portion of the first patterning layer;

removing a first portion of the interlevel dielectric that is exposed by the first opening;

removing the portion of the first patterning layer exposed by the second opening; and removing a second portion of the interlevel dielectric layer that is exposed by the second opening and a third portion of the interlevel dielectric layer defined by the first opening to define a dual inlaid opening in the interlevel dielectric layer; and removing the second patterning layer and the first patterning layer.

2. The method of claim 1, wherein the interlevel dielectric layer is formed over a conductive interconnect and further comprises:

a first etch stop film over the interconnect;

a first dielectric film over the first etch stop layer;

a second etch stop film over the first dielectric layer; and a second dielectric film over the second etch stop layer.

3. The method of claim 2, wherein:

removing a first portion of the interlevel dielectric layer that is exposed by the first opening includes removing a first portion of the second dielectric film;

removing a second portion of the interlevel dielectric layer that is exposed by the second opening includes removing a second portion of the second dielectric layer; and removing a third portion of the interlevel dielectric layer defined by the first opening includes removing a first portion of the first dielectric film.

4. The method of claim 3, wherein removing a second portion and removing a third portion are performed simultaneously during a same processing sequence.

5. The method of claim 1 further comprising:

forming a conductive film within the dual inlaid opening;

polishing the conductive film to form a dual inlaid interconnect; and forming a passivation layer over the dual inlaid interconnect.

6. The method of claim 1 further comprising deep ultra violet baking the first patterning layer prior to forming the second patterning layer.

7. The method of claim 1, wherein the first patterning layer is a positive resist and the second patterning layer is a negative photoresist.

8. The method of claim 1 wherein the first patterning layer is a negative resist and the second patterning layer is a positive photoresist.

9. The method of claim 1, wherein removal of the first and second portions defines a trench portion of the dual-inlaid opening and wherein removal of the third portion defines a via portion of the dual inlaid opening.

10. The method of claim 1, wherein the first opening defines a contact portion for the dual inlaid opening and wherein the second opening defines a trench portion for the dual inlaid opening.

11. The method of claim 10, wherein the via portion is self aligned to the trench portion.

12. The method of claim 11 wherein a widest dimension of the first opening is at least as wide as a width dimension of the second opening and wherein a bottom dimension of the trench and a top dimension of the via are the same dimension.

13. A method for forming a semiconductor device comprising:
- forming a conductive region over a semiconductor device substrate;
- forming a first dielectric film over the conductive region;
- forming a second dielectric film over the first dielectric film;
- forming a first patterning layer over the second dielectric film;
- defining a via opening in the first patterning layer;
- forming a second patterning layer over the first patterning layer;
- defining a trench opening in the second patterning layer, wherein the trench opening exposes a portion of the via opening and a portion of the first patterning layer;
- removing a first portion of the second dielectric film that is exposed by the via opening to define a via pattern in the second dielectric film;
- removing the portion of the first patterning layer exposed by the second patterning layer to expose a second portion of the second dielectric film;
- removing the second portion of the second dielectric film exposed by the second patterning layer to define a trench portion of a dual inlaid opening in the second dielectric film;
- removing a portion of the first dielectric film defined by the via pattern to expose the conductive region and form a via portion of the dual inlaid opening in the first dielectric film;
- removing the second patterning layer and the first patterning layer; depositing a conductive film overlying the semiconductor device substrate and within the dual inlaid opening; and
- removing portions of the conductive film not contained in the dual inlaid opening to define a dual inlaid interconnect.

14. The method of claim 13 further comprising baking the first patterning layer prior to forming the second patterning layer.

15. The method of claim 13, wherein the first patterning layer is a positive resist and the second patterning layer is a negative photoresist.

16. The method of claim 13, wherein the first patterning layer is a negative resist and the second patterning layer is a positive photoresist.

17. The method of claim 13, wherein the via portion is self aligned to the trench portion.

18. The method of claim 13, wherein a widest dimension of the via opening is at least as wide as a width dimension of the trench opening and wherein a bottom dimension of the trench portion and a top dimension of the via portion are the same dimension.

19. The method of claim 13, further comprising forming:
- forming a first etch stop layer between the conductive region and the first dielectric layer; and
- forming a second etch stop layer between the second dielectric layer and the first dielectric layer.

20. The method of claim 13, wherein removing a first portion of the second dielectric film, removing the portion of the first patterning layer, removing the second portion of the second dielectric film, and removing a portion of the first dielectric film are all performed in a single etch processing chamber during a single etch processing sequence.

* * * * *